United States Patent
Li et al.

(10) Patent No.: US 6,602,779 B1
(45) Date of Patent: Aug. 5, 2003

(54) METHOD FOR FORMING LOW DIELECTRIC CONSTANT DAMASCENE STRUCTURE WHILE EMPLOYING CARBON DOPED SILICON OXIDE PLANARIZING STOP LAYER

(75) Inventors: Lain-Jong Li, Hsin-Chu (TW); Yung-Cheng Lu, Taipei (TW); Chung-Chi Ko, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/144,522

(22) Filed: May 13, 2002

(51) Int. Cl.[7] .......................................... H01L 21/4763
(52) U.S. Cl. ........................ 438/622; 438/624; 438/631; 438/633; 438/634; 438/636; 438/637; 438/638
(58) Field of Search .......................... 438/622, 624, 438/631, 633, 634, 636, 637, 638

(56) References Cited

U.S. PATENT DOCUMENTS

| 4,992,306 A | 2/1991 | Hochberg et al. |
| 6,072,227 A | 6/2000 | Yau et al. |
| 6,107,184 A | 8/2000 | Mandal et al. |
| 6,114,259 A | 9/2000 | Sukharev et al. |
| 6,171,945 B1 | 1/2001 | Mandal et al. |
| 6,455,417 B1 * | 9/2002 | Bao et al. .................... 438/637 |
| 2002/0142578 A1 * | 10/2002 | Xia et al. .................... 438/624 |
| 2002/0142585 A1 * | 10/2002 | Mandal .................... 438/633 |

* cited by examiner

Primary Examiner—John F. Niebling
Assistant Examiner—Lynne A. Gurley
(74) Attorney, Agent, or Firm—Tung & Associates

(57) ABSTRACT

Within a damascene method for forming a patterned conductor layer having formed interposed between its patterns a dielectric layer formed of a comparatively low dielectric constant dielectric material method, there is employed a hard mask layer formed upon the dielectric layer. The hard mask layer is formed employing a plasma enhanced chemical vapor deposition (PECVD) method in turn employing an organosilane carbon and silicon source material, a substrate temperature of from about 200 to about 500 degrees centigrade and a radio frequency power of from about 100 to about 500 watts per square centimeter substrate area. The hard mask layer provides for attenuated abrasive damage to the dielectric layer.

15 Claims, 2 Drawing Sheets

METHOD FOR FORMING LOW DIELECTRIC CONSTANT DAMASCENE STRUCTURE WHILE EMPLOYING CARBON DOPED SILICON OXIDE PLANARIZING STOP LAYER

BACKGROUND OF THE INVENTION

1. Field of the Invention

The present invention relates generally to methods for forming damascene structures within microelectronic fabrications. More particularly, the present invention relates to methods for forming low dielectric constant damascene structures within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials, such comparatively low dielectric constant dielectric materials generally having dielectric constants in a range of from about 1.5 to less than about 3.5. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from greater than about 4.5 to about 7.0. Similarly, such patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming patterned microelectronic conductor layers having formed interposed between their patterns microelectronic dielectric layers formed of comparatively low dielectric constant dielectric materials within microelectronic fabrications, damascene methods are nonetheless not entirely without problems in the art of microelectronic fabrication for forming patterned microelectronic conductor layers having formed interposed between their patterns microelectronic dielectric layers formed of comparatively low dielectric constant dielectric materials within microelectronic fabrications. In that regard, while damascene methods are generally successful for forming patterned microelectronic conductor layers having formed interposed between their patterns microelectronic dielectric layers formed of comparatively low dielectric constant dielectric materials within microelectronic fabrications, such damascene methods often provide abrasive damage to the microelectronic dielectric layers formed of the comparatively low dielectric constant dielectric materials.

It is thus desirable in the art of microelectronic fabrication to provide damascene methods which may be employed in the art of microelectronic fabrication for providing patterned microelectronic conductor layers having formed interposed between their patterns microelectronic dielectric layers formed of comparatively low dielectric constant dielectric materials, with attenuated abrasive damage to the microelectronic dielectric layers formed of the comparatively low dielectric constant dielectric materials.

It is towards the foregoing object that the present invention is directed.

Various methods and apparatus have been disclosed in the art of microelectronic fabrication for forming microelectronic layers, and in particular microelectronic dielectric layers, with desirable properties in the art of microelectronic fabrication.

Included among the methods and apparatus, but not limited among the methods and apparatus, are methods and apparatus disclosed within: (1) Hochberg et al., in U.S. Pat. No. 4,992,306 (a low pressure chemical vapor deposition (LPCVD) method for forming within a microelectronic fabrication, and at a comparatively low deposition temperature of from about 325 to about 700 degrees centigrade, and with a comparatively high deposition rate, a silicon oxide dielectric layer, a silicon nitride dielectric layer or a silicon oxynitride dielectric layer, while employing in conjunction with an oxidant source material a silicon source material comprising a two or greater carbon atom content alkylazidosilane, arylazidosilane or alkylarylazidosilane; (2) Yau et al., in U.S. Pat. No. 6,072,227 (a method and an apparatus for forming within a microelectronic fabrication, and with enhanced barrier properties and enhanced etch stop properties, a microelectronic dielectric layer formed of a lower dielectric constant dielectric material formed employing a plasma enhanced chemical vapor deposition (PECVD) method employing a silicon source material comprising an organosilane, preferably methylsilane, along with an oxidant source material, preferably nitrous oxide; (3) Mandal et al., in U.S. Pat. No. 6,107,184 and U.S. Pat. No. 6,171,945 (methods and apparatus for forming within a microelectronic fabrication a microelectronic dielectric layer formed of a comparatively low dielectric constant dielectric material comprising a nanoporous organic copolymer dielectric material or a nanoporous silicon oxide based dielectric material; and (4) Sukharev et al., in U.S. Pat. No. 6,114,259 (a method for treating within a microelectronic fabrication exposed portions of a microelectronic dielectric layer formed of a comparatively low dielectric constant carbon doped silicon oxide dielectric material such as to avoid subsequent oxidizing plasma etch damage to the microelectronic dielectric layer).

Desirable in the art of microelectronic fabrication are damascene methods and materials which may be employed in the art of microelectronic fabrication for providing patterned microelectronic conductor layers having formed interposed between their patterns microelectronic dielectric layers formed of comparatively low dielectric constant dielectric materials, with attenuated abrasive damage to the microelectronic dielectric layers.

It is towards the foregoing object that the present invention is directed.

SUMMARY OF THE INVENTION

A first object of the present invention is to provide a damascene method for forming within a microelectronic fabrication a patterned microelectronic conductor layer having formed interposed between its patterns a microelectronic dielectric layer formed of a comparatively low dielectric constant dielectric material.

A second object of the present invention is to provide a damascene method in accord with the first object of the present invention, wherein the patterned microelectronic conductor layer is formed with attenuated abrasive damage to the microelectronic dielectric layer.

A third object of the present invention is to provide a damascene method in accord with the first object of the present invention and the second object of the present invention, wherein the damascene method is readily commercially implemented.

In accord with the objects of the present invention, there is provided by the present invention a damascene method for forming a patterned microelectronic conductor layer within a microelectronic fabrication.

To practice the method of the present invention, there is first provided a substrate. There is then formed over the substrate a dielectric layer, where the dielectric layer is formed of a comparatively low dielectric constant dielectric material. There is then formed upon the dielectric layer a patterned hard mask layer, where the patterned hard mask layer is formed of a carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area. There is then etched the dielectric layer to form therein an aperture while employing at least the patterned hard mask layer as an etch mask layer. Finally, there is then formed into the aperture a patterned conductor layer while employing a damascene method which employs the patterned hard mask layer as a planarizing stop layer.

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with attenuated abrasive damage to the microelectronic dielectric layer.

The present invention realizes the foregoing object by employing within the damascene method, and formed upon a blanket dielectric layer within which is formed an aperture within which is formed the patterned conductor layer while employing the damascene method, a patterned hard mask layer which is employed as: (1) a low dielectric constant anti-reflective coating, i.e. replace current 52 or ARC; (2) a CMP mask to avoid scratching; and (3) as a via liner to separate PR and low h. Within the method of the present invention, the patterned hard mask layer is formed of a carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area.

The damascene method in accord with the present invention is readily commercially implemented.

As will be illustrated in greater detail within the context of the Description of the Preferred Embodiment, as set forth below, the damascene method of the present invention employs methods and materials as are otherwise generally known in the art of microelectronic fabrication, but employed within the context of specific process limitations to provide the damascene method of the present invention. Since it is thus at least in part a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with attenuated abrasive damage to the microelectronic dielectric layer.

The present invention realizes the foregoing object by employing within the damascene method, and formed upon a blanket dielectric layer within which is formed an aperture within which is formed the patterned conductor layer while employing the damascene method, a patterned hard mask layer which is employed as: (1) an etch mask for forming the aperture within the blanket dielectric layer; and (2) a planarizing stop layer when forming within the aperture the patterned conductor layer while employing the damascene method. Within the method of the present invention, the patterned hard mask layer is formed of a carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area.

Although the preferred embodiment of the present invention provides particular value within the context of forming, while employing a damascene method, and within a semiconductor integrated circuit microelectronic fabrication, a patterned microelectronic conductor layer having formed interposed between its patterns a microelectronic dielectric layer formed of a comparatively low dielectric constant dielectric material, the present invention may nonetheless be employed for forming patterned conductor layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in forming, in accord with a preferred embodiment of the present invention, a patterned microelectronic conductor layer within a microelectronic fabrication while employing a damascene method.

Figure 1:
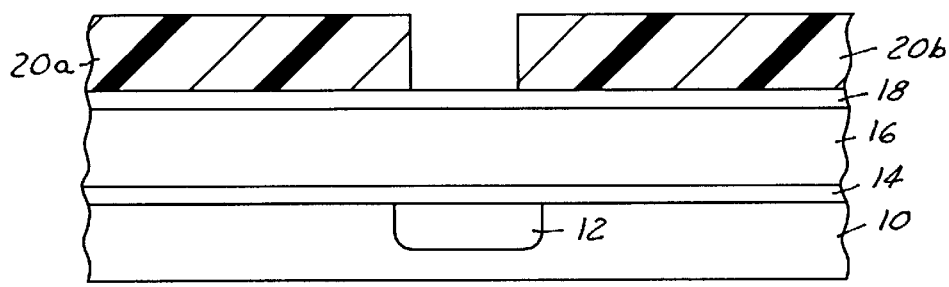
FIG. 1, FIG. 2, FIG. 3 and FIG. 4 show a series of schematic cross-sectional diagrams illustrating the results of progressive stages of forming, in accord with a preferred embodiment of the present invention, a patterned conductor layer within a microelectronic fabrication.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiments of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate employed within a semiconductor integrated circuit microelectronic fabrication; or (2) a conductor contact region, under circumstances where the substrate 10 is employed within any of the several microelectronic fabrications as noted above.

Shown also within the schematic cross-sectional diagram of FIG. 1, and formed upon the substrate 10 having formed therein the contact region 12, is a series of blanket layers comprising: (1) a blanket liner layer 14 formed upon the substrate 10 having formed therein the contact region 12; (2) a blanket dielectric layer 16 formed upon the blanket liner layer 14; and (3) a blanket hard mask layer 18 formed upon the blanket dielectric layer 16. Finally, there is also shown within the schematic diagram of FIG. 1, and formed upon the blanket hard mask layer 18, a pair of patterned photoresist layers 20a and 20b.

Within the preferred embodiment of the present invention, and with respect to the blanket liner layer 14 and more particularly with respect to the blanket hard mask layer 18, at least the blanket hard mask layer 18 and more particularly both the blanket liner layer 14 and the blanket hard mask layer 18 are formed of a carbon doped silicon oxide dielectric material formed employing a plasma enhanced chemical vapor deposition (PECVD) method in turn employing an organosilane carbon and silicon source material, an oxidant source material (which may be intrinsic to the organosilane carbon and silicon source material) and optionally a nitrogen source material, while further employing a substrate 10 temperature of from about 200 to about 500 degrees centigrade, more preferably from about 300 to about 500 degrees centigrade and most preferably from about 350 to about 450 degrees centigrade and a radio frequency power of from about 100 to about 500 watts per square centimeter substrate 10 area, more preferably from about 200 to about 500 watts per square centimeter substrate 10 area and most preferably from about 300 to about 500 watts per square centimeter substrate 10 area.

Within the preferred embodiment of the present invention, and although any of several organosilanes may be employed when forming the blanket liner layer 14 and more particularly the blanket hard mask layer 18, including but not limited to alkylorganosilanes, arylorganosilanes and alkylarylorganosilanes as are disclosed within Yau et al, as cited within the Description of the Related Art, the teachings of all of which related art are incorporated herein fully by reference, typically and preferably the organosilane is trimethylsilane, but not an azidosilane. Similarly, within the present invention and the preferred embodiment of the present invention, an organosilane is intended as a carbon and silicon containing molecule with up to four carbon-silicon bonds, with the remainder carbon-hydrogen bonds, and is not intended to include carbon, silicon and oxygen containing molecules, such as but not limited to tetraethylorthosilicate (TEOS) which comprise oxygen-silicon bonds.

In addition, although any of several oxidant source materials may also be employed when forming the blanket liner layer 14 and in particular the blanket hard mask layer 18, including but not limited to oxygen, ozone, nitrous oxide and nitric oxide, typically and preferably, the oxidant source material is nitrous oxide. Finally, although any of several optional nitrogen source materials may be employed when forming the blanket liner layer 14 and in particular the blanket hard mask layer 18, including but not limited to nitrogen, ammonia and hydrazine, the optional nitrogen source material is typically and preferably ammonia.

Typically and preferably, the plasma enhanced chemical vapor deposition (PECVD) method for forming the blanket liner layer 14, and in particular the blanket hard mask layer 18, also employs: (1) a trimethlysilane organosilane silicon and carbon source material flow rate of from about 200 to about 750 standard cubic centimeters per minute (sccm); (2) a nitrous oxide oxidant source material flow rate of from about 50 to about 300 standard cubic centimeters per minute (sccm); (3) an optional ammonia nitrogen source material flow rate of up to about 100 standard cubic centimeters per minute (sccm); and (4) a background helium, nitrogen or argon diluent flow rate of from about 100 to about 300 standard cubic centimeters per minute (sccm). Typically and preferably, the blanket liner layer 14 is formed to a thickness of from about 300 to about 1000 angstroms, more preferably from about 400 to about 700 angstroms and most preferably from about 400 to about 600 angstroms, while the blanket hard mask layer 18 is formed to a thickness of from about 300 to about 2000 angstroms, more preferably from about 600 to about 1500 angstroms and most preferably from about 6000 to about 12000 angstroms.

As is further understood by a person skilled in the art, the blanket liner layer 14 is formed of a thickness minimally sufficient to provide a barrier between the substrate 10 and the dielectric layer 16, while the blanket hard mask layer 18 is similarly analogously formed to a thickness minimally sufficient to serve as both a hard mask layer and a planarizing stop layer and ARC (anti-reflective coating) in accord with further processing of the microelectronic fabrication whose schematic cross-sectional diagram is illustrated in FIG. 1.

Within the preferred embodiment of the present invention with respect to the dielectric layer 16, the dielectric layer 16 may be formed from any of several comparatively low dielectric constant dielectric materials as are conventional or unconventional in the art of microelectronic fabrication, including but not limited to spin-on-glass (SOG) dielectric materials, spin-on-polymer (SOP) dielectric materials, nanoporous dielectric materials, amorphous carbon dielectric materials and fluorosilicate glass (FSG) dielectric materials. Typically and preferably, the dielectric layer 16 is formed to a thickness of from about 2000 to about 9000 angstroms.

As a particularly desirable option within the present invention, and under circumstances where at least the blanket hard mask layer 18, and more particularly where both the blanket barrier layer 14 and the blanket hard mask layer 18, are formed of a carbon doped silicon oxide dielectric material formed in accord with the process limitations as noted above, it is possible to form the blanket dielectric layer 16 from a carbon doped silicon oxide dielectric material employing the same organosilane carbon and silicon source material as the blanket liner layer 14 and the blanket hard mask layer 18. The difference between 16 and 18 is not deposition temperature. To control the difference gas ration and the different gas in similar conditions to get the low R (16) and etch-stop layer (18). For example, we did not use aHs as gas source when depositing low R (16) dielectric layer 16 with a considerably lower dielectric constant (in a range of from about 2.5 to about 3.5) than the blanket liner layer 14 or the blanket hard mask layer 18. Similarly, and under such circumstances, it is also plausible within the present invention to grade both the interface of the blanket liner layer 14 with the blanket dielectric layer 16 and the interface of the blanket dielectric layer 16 with the blanket hard mask layer 18, such as to provide a bidirectionally graded dielectric layer which comprises the blanket liner layer 14, the blanket dielectric layer 16 and the blanket hard mask layer 18 with a higher density in the locations of the blanket liner layer 14 and the blanket hard mask layer 18.

Finally, within the preferred embodiment of the present invention with respect to the pair of patterned photoresist layers 20a and 20b, the pair of patterned photoresist layers 20a and 20b may be formed from any of several photoresist materials as are conventional in the art of microelectronic fabrication, including but not limited to photoresist materials selected from the general groups of photoresist materials including but not limited to positive photoresist materials and negative photoresist materials. Typically and preferably, each of the pair of patterned photoresist layers 20a and 20b is formed to a thickness of from about 7000 to about 15000 angstroms.

Figure 2:
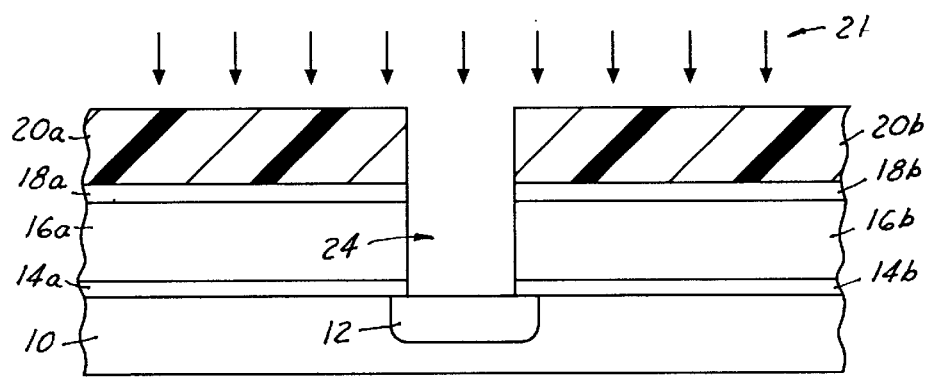

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the series of blanket layers comprising: (1) the blanket hard mask layer 18, formed upon; (2) the blanket dielectric layer 16, in turn formed upon; (3) the blanket liner layer 14, has been patterned for form a corresponding series of pairs of patterned layers comprising: (1) a pair of patterned hard mask layers 18a and 18b, formed upon (2) a pair of patterned dielectric layers 16a and 16b, in turn formed upon (3) a pair of patterned liner layers 14a and 14b, while employing the pair of patterned photoresist layers 20a and 20b as a pair of etch mask layers, in conjunction with an etching plasma 22. As is illustrated within the schematic cross-sectional diagram of FIG. 2, the pair of patterned liner layers 14a and 14b, the pair of patterned dielectric layers 16a and 16b and the pair of patterned hard mask layers 18a and 18b define, in an aggregate, an aperture 24.

Within the preferred embodiment of the present invention with respect to the etching plasma 21, the etching plasma 21 may employ an etchant gas composition (or a series of etchant gas compositions) as is conventional or unconventional in the art of microelectronic fabrication for etching the materials from which are formed the series of blanket layers comprising: (1) the blanket hard mask layer 18; (2) the blanket dielectric layer 16; and (3) the blanket liner layer 14. Under circumstances where the blanket hard mask layer 18, the blanket dielectric layer 16 and the blanket liner layer 14 are formed of separate but graded contiguous carbon doped silicon oxide dielectric materials as discussed in greater detail above, formed employing the continuous plasma enhanced chemical vapor deposition (PECVD) method as discussed in greater detail above, the etching plasma 22 will typically and preferably employ a fluorine containing etchant gas, in conjunction with an argon sputtering gas.

Typically and preferably, with respect to etching the blanket hard mask layer 18, the blanket dielectric layer 16 and the blanket liner layer 14 as illustrated within the schematic cross-sectional diagram of FIG. 1 when formed upon an eight inch diameter substrate 10 to provide the pair of pair of patterned hard mask layers 18a and 18b, the pair of patterned dielectric layers 16a and 16b and the pair of patterned liner layers 14a and 14b as illustrated within the schematic cross-sectional diagram of FIG. 2.

Figure 3:
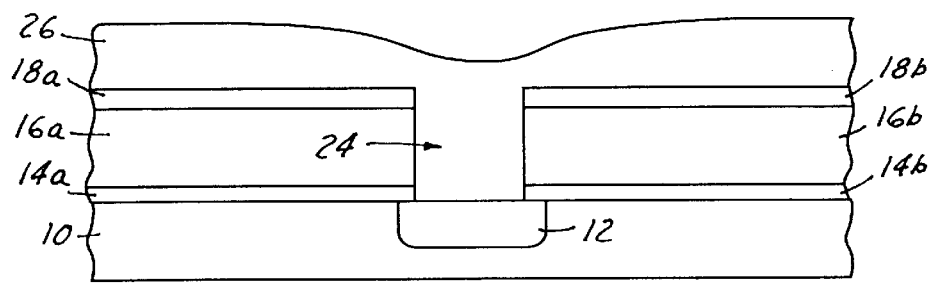

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned photoresist layers 20a and 20b has been stripped from the microelectronic fabrication.

Within the present invention and preferred embodiment of the present invention, the pair of patterned photoresist layers 20a and 20b may be stripped from the microelectronic fabrication whose schematic cross-sectional diagram is illustrated in FIG. 2 to provide in part the microelectronic fabrication whose schematic cross-sectional diagram is illustrated in FIG. 3 while employing photoresist stripping methods as are otherwise conventional in the art of microelectronic fabrication. Such photoresist stripping methods may be selected from the group including but not limited to wet chemical photoresist stripping methods, dry plasma photoresist stripping methods and aggregate photoresist stripping methods thereof.

Similarly, there is also shown within the schematic cross-sectional diagram of FIG. 3, and formed upon exposed portions of the pair of patterned hard mask layers 18a and 18b, the pair of dielectric layers 16a and 16b, the pair of patterned liner layers 14a and 14b and the contact region 12, a blanket conductor layer 26 which completely fills the aperture.

Within the preferred embodiment of the present invention with respect to the blanket conductor layer 26, the blanket conductor layer 26 may be formed of conductor materials as are conventional or unconventional in the art of microelectronic fabrication, such conductor materials being selected from the group including but not limited to metal and metal alloy conductor materials, more particularly aluminum, aluminum alloy, copper or copper alloy conductor materials, and most preferably copper or copper alloy (having a copper content of at least about 60–90 weight percent) conductor materials. Typically and preferably, the blanket conductor layer 26 is formed to a thickness of from about 2000 to about 9000 angstroms and will typically and preferably include, formed as its lower portion, a blanket barrier layer, to thus inhibit interdiffusion of the conductor material from which is formed the main portion of the blanket conductor layer 26 with any of the materials from which are formed adjoining layers within the microelectronic fabrication whose schematic cross-sectional diagram is illustrated in FIG. 3.

Figure 4:
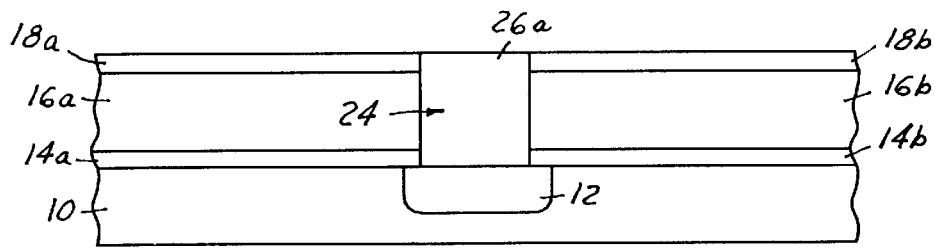

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the blanket conductor layer 26 has been planarized to form a patterned planarized conductor layer 26a within the aperture 24.

Within the present invention and the preferred embodiment of the present invention, the blanket conductor layer 26 may be planarized to form the patterned planarized conductor layer 26a within the aperture 24 while employing methods as are conventional in the art of microelectronic fabrication, and in particular chemical mechanical polish (CMP) planarizing methods.

Upon forming the microelectronic fabrication whose schematic cross-sectional diagram is illustrated in FIG. 4, there is formed within a microelectronic fabrication, while employing a damascene method, a patterned conductor layer whose patterns are separated by a dielectric layer formed of a comparatively low dielectric constant dielectric material within the microelectronic fabrication, with attenuated physical abrasion of the dielectric layer. The present invention realizes the foregoing object by employing when fabricating the patterned conductor layer while employing the damascene method a patterned hard mask layer formed upon the dielectric layer, wherein the patterned hard mask layer is formed from a carbon doped silicon oxide material formed employing a plasma enhanced chemical vapor deposition (PECVD) method in turn employing an organosilane carbon and silicon source material, preferably trimethylsilane, deposited employing a substrate temperature of from about 200 to about 500 degrees centigrade and a radio frequency power of from about 100 to about 500 watts per square centimeter substrate area.

As is understood by a person skilled in the art, although the preferred embodiment of the present invention illustrates the present invention within the context of a patterned conductor layer having formed interposed between its patterns a dielectric layer formed of a comparatively low dielectric constant dielectric material further within the context of a single damascene method, the present invention may also be applied within the context of dual damascene methods and higher order damascene methods, as are more specifically illustrated within the references cited within the Description of the Related Art.

Figure 6:
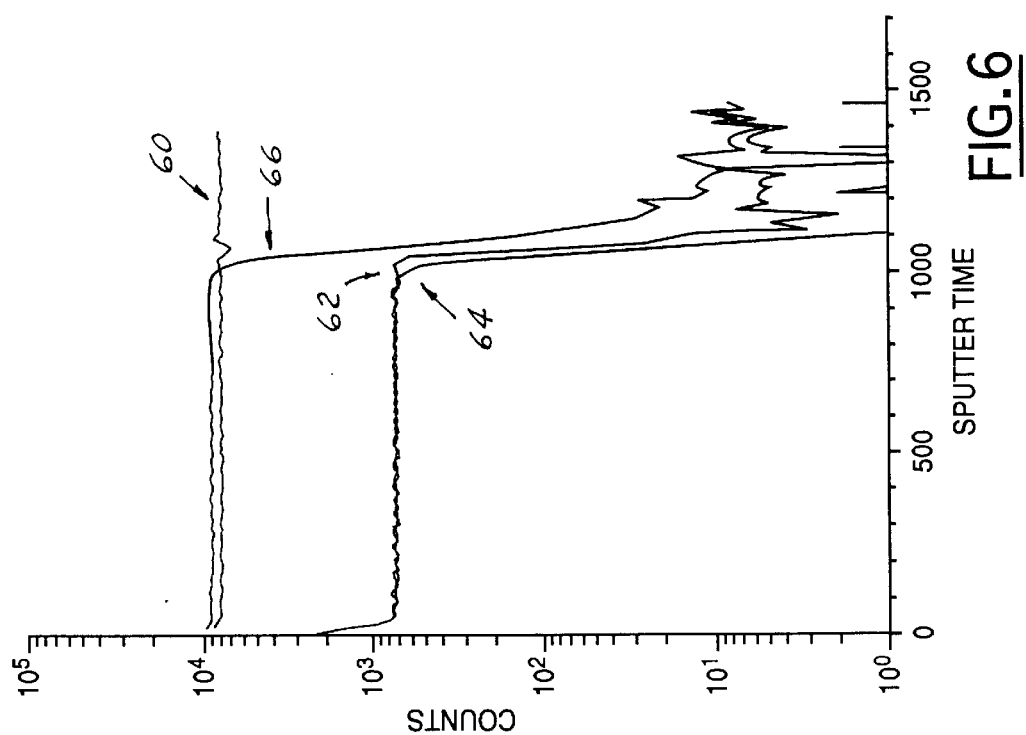
FIG. 5 and FIG. 6 show a pair of diagrams of Counts versus Sputter Time for secondary ion mass spectroscopy (SIMS) sputtering of a pair of hard mask material layers, one of which is formed in accord with the present invention.
Figure 5:
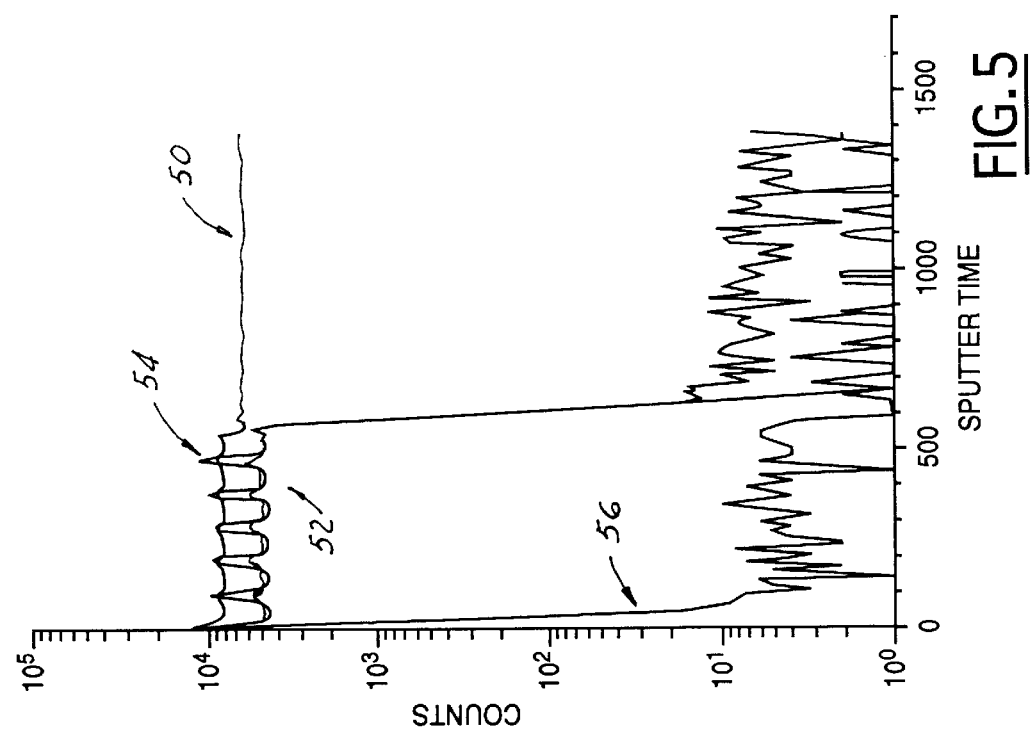

Referring now to FIG. 5 and FIG. 6, there is shown a pair of schematic diagrams of Counts versus Sputter Time, illustrating elemental composition of a pair of hard mask layers, one of which is formed in accord with the present invention.

Each of the pair of hard mask layers whose elemental compositions are illustrated within the graphs of FIG. 5 and FIG. 6 was formed upon a silicon semiconductor substrate while employing a plasma enhanced chemical vapor deposition (PECVD) method while employing either a silicon source material (to provide a silicon oxynitide hard mask material) or a trimethylsilane silicon and carbon source material (to provide carbon and nitrogen doped silicon oxide material), in conjunction with a nitrous oxide oxidant source material, an ammonia nitrogen source material and a helium diluent gas. The plasma enhanced chemical vapor deposition (PECVD) method employed for forming either of the foregoing two hard mask materials upon an eight inch diameter semiconductor substrate: (1) a reactor chamber pressure of about 0.5 torr; (2) a source radio frequency power of about 300 watts; (3) a silane silicon source material or a trimethylsilane carbon and silicon source material flow rate of about 600 standard cubic centimeters per minute (sccm); (4) a nitrous oxide oxidant flow rate of about 100 standard cubic centimeters per minute (sccm); (5) an ammonia nitrogen source material flow rate of about 100 standard cubic centimeters per minute (sccm); and (6) a helium diluent gas flow rate of about 100 standard cubic centimeters per minute (sccm). The temperature for forming the two hard mask layers is about 350 degrees centigrade.

Shown in FIG. 5 is the graph of Counts versus Sputter Time for the hard mask layer formed of the silicon oxynitride material formed upon the silicon semiconductor substrate, where the curves which correspond with reference numerals 50, 52, 54 and 56 correspond, respectively and relatively, with silicon, oxygen, nitrogen and carbon content.

Shown in FIG. 6 is the graph of Counts versus Sputter Time for the hard mask layer formed of the carbon doped silicon oxynitride material formed upon the silicon semiconductor substrate, where the curves which correspond with reference numeral 60, 62, 64, and 66 correspond, respectively and relatively, with silicon oxygen, nitrogen and carbon content.

Similarly, there was also measured a somewhat lower dielectric constant of about 4.5 for the hard mask material layer in accord with FIG. 6, in comparison with a dielectric constant of about 5.0 for the hard mask material layer in accord with FIG. 5.

It is seen from review of the graphs which correspond with FIG. 5 and FIG. 6 that there is uniformly incorporated carbon into the carbon doped silicon oxynitide layer which may be employed as a hardmask layer in accord with the present invention.

As is understood by a person skilled in the art, the preferred embodiment of the present invention is illustrative of the present invention rather than limiting of the present invention. Revisions and modifications may be made to methods, materials, structures and dimensions through which is provided a patterned conductor layer in accord with the preferred embodiment of the present invention, which still providing a method for forming a patterned conductor layer in accord with the present invention, further in accord with the accompanying claims.

What is claimed is:

1. A damascene method for forming a patterned conductor layer comprising:

providing a substrate;

forming over the substrate a dielectric layer, the dielectric layer being formed of a comparatively low dielectric constant dielectric material;

forming upon the dielectric layer a patterned hard mask layer, the patterned hard mask layer being formed of a carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer.

2. A damascene method for forming a patterned conductor layer comprising:

providing a substrate;

forming over the substrate a dielectric layer, the dielectric layer being formed of a comparatively low dielectric constant dielectric material;

forming upon the dielectric layer a patterned hard mask layer, the patterned hard mask layer being formed of a carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer, wherein the patterned hard mask layer provides for attenuated abrasive damage to the dielectric layer when forming into the aperture the patterned conductor layer while employing the damascene method.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the comparatively low dielectric constant dielectric material is selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

5. A damascene method for forming a patterned conductor layer comprising:

providing a substrate;

forming over the substrate a dielectric layer, the dielectric layer being formed of a comparatively low dielectric constant dielectric material;

forming upon the dielectric layer a patterned hard mask layer, the patterned hard mask layer being formed of a carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer, wherein the comparatively low dielectric constant dielectric material is formed employing the same organosilane carbon and silicon source material as the patterned hard mask layer, to provide the dielectric layer graded with the patterned hard mask layer.

6. The method of claim 1 wherein the dielectric layer is formed to a thickness of from about 2000 to about 9000 angstroms.

7. A damascene method for forming a patterned conductor layer comprising:

providing a substrate;

forming over the substrate a dielectric layer, the dielectric layer being formed of a comparatively low dielectric constant dielectric material;

forming upon the dielectric layer a patterned hard mask layer, the patterned hard mask layer being formed of a nitrogen and carbon doped silicon oxide material formed employing a plasma enhanced chemical vapor deposition (PECVD) method in turn employing an organosilane carbon and silicon source material, a substrate temperature of from about 200 to about 500 degrees centigrade and a radio frequency deposition power of from about 100 to about 500 watts per square centimeter substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer.

8. The method of claim 1 wherein the patterned hard mask layer is formed to a thickness of from about 300 to about 900 angstroms.

9. A damascene method for forming a patterned conductor layer comprising:

providing a semiconductor substrate;

forming over the semiconductor substrate a dielectric layer, the dielectric layer being formed of a comparatively low dielectric constant dielectric material;

forming upon the dielectric layer a patterned hard mask layer, the patterned hard mask layer being formed of a carbon doped silicon oxide material formed employing a plasma enhanced chemical vapor deposition (PECVD) method in turn employing an organosilane carbon and silicon source material, a semiconductor substrate temperature of from about 200 to about 500 degrees centigrade and a radio frequency deposition power of from about 100 to about 500 watts per square centimeter semiconductor substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer.

10. A damascene method for forming a patterned conductor layer comprising:

providing a semiconductor substrate;

forming over the semiconductor substrate a dielectric layer, the dielectric layer being formed of a comparatively low dielectric constant dielectric material;

forming upon the dielectric layer a patterned hard mask layer, the patterned hard mask layer being formed of a carbon doped silicon oxide material formed employing a plasma enhanced chemical vapor deposition (PECVD) method in turn employing an organosilane carbon and silicon source material, a semiconductor substrate temperature of from about 200 to about 500 degrees centigrade and a radio frequency deposition power of from about 100 to about 500 watts per square centimeter semiconductor substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer, wherein the patterned hard mask layer provides for attenuated abrasive damage to the dielectric layer when forming into the aperture the patterned conductor layer while employing the damascene method.

11. The method of claim 9 wherein the comparatively low dielectric constant dielectric material is selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

12. A damascene method for forming a patterned conductor layer comprising:

providing a semiconductor substrate;

forming over the semiconductor substrate a dielectric layer, the dielectric layer being formed of a comparatively low dielectric constant dielectric material;

forming upon the dielectric layer a patterned hard mask layer, the patterned hard mask layer being formed of a carbon doped silicon oxide material formed employing a plasma enhanced chemical vapor deposition (PECVD) method in turn employing an organosilane carbon and silicon source material, a semiconductor substrate temperature of from about 200 to about 500 degrees centigrade and a radio frequency deposition power of from about 100 to about 500 watts per square centimeter semiconductor substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer, wherein the comparatively low dielectric constant dielectric material is formed employing the same organosilane carbon and silicon source material as the patterned hard mask layer, to provide the dielectric layer graded with the patterned hard mask layer.

13. The method of claim 9 wherein the dielectric layer is formed to a thickness of from about 2000 to about 9000 angstroms.

14. A damascene method for forming a patterned conductor layer comprising:

providing a semiconductor substrate;

forming over the semiconductor substrate a dielectric layer, the dielectric layer being formed of a comparatively low dielectric constant dielectric material;

forming upon the dielectric layer a patterned hard mask layer, the patterned hard mask layer being formed of a nitrogen and carbon doped silicon oxide material formed employing a plasma enhanced chemical vapor deposition (PECVD) method in turn employing an organosilane carbon and silicon source material, a semiconductor substrate temperature of from about 200 to about 500 degrees centigrade and a radio frequency deposition power of from about 100 to about 500 watts per square centimeter semiconductor substrate area;

etching the dielectric layer to form therein an aperture while employing at least the patterned hard mask layer as an etch mask layer; and forming into the aperture a patterned conductor layer while employing a damascene method which employs the patterned hard mask layer as a planarizing stop layer.

15. The method of claim 9 wherein the patterned hard mask layer is formed to a thickness of from about 300 to about 700 angstroms.

* * * * *